(12) United States Patent
Whiting et al.

(10) Patent No.: US 7,402,899 B1
(45) Date of Patent: Jul. 22, 2008

(54) HERMETICALLY SEALABLE SILICON SYSTEM AND METHOD OF MAKING SAME

(75) Inventors: James S. Whiting, Los Angeles, CA (US); Neal L. Eigler, Pacific Palisades, CA (US); Brian M. Mann, Beverly Hills, CA (US); Werner Hafelfinger, Thousand Oaks, CA (US)

(73) Assignee: Pacesetter, Inc., Sylmar, CA (US)

( * ) Notice: Subject to any disclaimer, the term of this patent is extended or adjusted under 35 U.S.C. 154(b) by 0 days.

(21) Appl. No.: 11/622,647

(22) Filed: Jan. 12, 2007

Related U.S. Application Data

(60) Provisional application No. 60/764,836, filed on Feb. 3, 2006.

(51) Int. Cl.
*H01L 21/30* (2006.01)

(52) U.S. Cl. ...................................... 257/678; 257/704
(58) Field of Classification Search ................. 257/678, 257/704
See application file for complete search history.

(56) References Cited

U.S. PATENT DOCUMENTS

| | | |
|---|---|---|
| 3,298,093 A | 1/1967 | Cohen |
| 4,625,561 A | 12/1986 | Mikkor |
| 5,668,033 A | 9/1997 | Ohara et al. |
| 6,232,150 B1 | 5/2001 | Lin et al. |
| 6,555,901 B1 | 4/2003 | Yoshihara et al. |
| 6,673,697 B2 * | 1/2004 | Ma et al. ..................... 438/455 |
| 7,243,833 B2 * | 7/2007 | Arana et al. ................. 228/246 |

* cited by examiner

*Primary Examiner*—Roy K Potter

(57) ABSTRACT

A device and method for hermetically sealing a medical device is provided. In one aspect, a silicon device is coupled to a sensor, such as a pressure transducer, which benefits from having direct contact with its environment, which in many cases, is the human body. Thus, a method to hermetically seal the non-sensing portion of a silicon device while allowing the sensing portion (e.g. the pressure transducer) to have direct contact with the body is provided. In one aspect, a silicon chip, a gold preform and a metallic housing are each primed for sealing and are assembled. The assembly is then heated to react the gold preform to the silicon chip and to form a molten gold-silicon alloy in-situ to bind the metallic housing to the non-sensing portion of the silicon chip. In this way, the non-sensing portion of the silicon chip is hermetically sealed and protected from exposure, while still permitting exposure of the sensing portion to the environment.

7 Claims, 6 Drawing Sheets

Fig. 1A
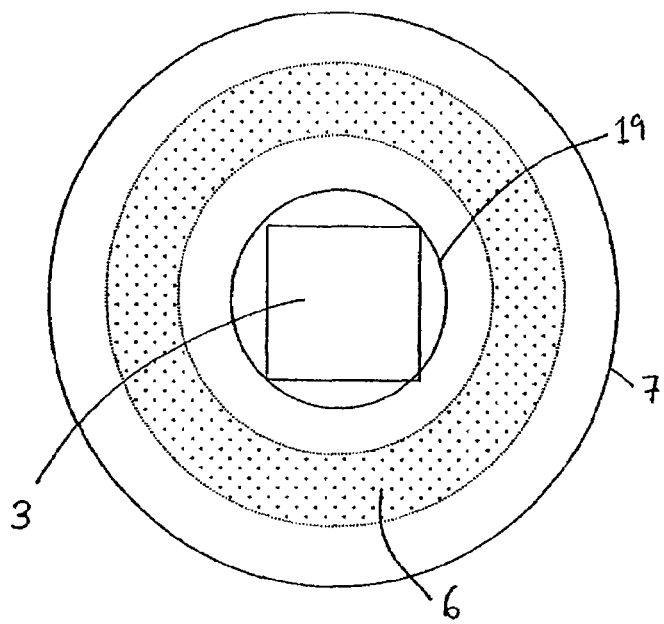
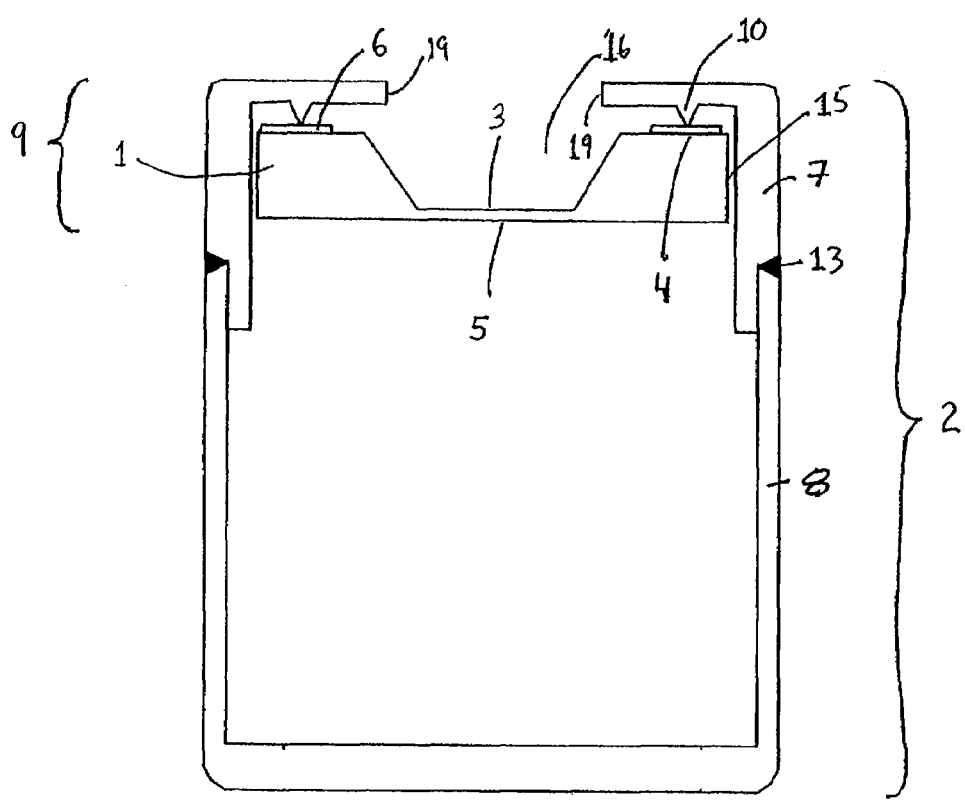
Fig. 1B

HERMETICALLY SEALABLE SILICON SYSTEM AND METHOD OF MAKING SAME

CROSS-REFERENCE TO RELATED APPLICATIONS

This application claims the benefit of U.S. Provisional Patent Application Ser. No. 60/764,836, filed Feb. 3, 2006.

BACKGROUND OF THE INVENTION

1. Field of the Invention

This invention generally relates to the field of hermetically sealed systems and methods of making of such systems.

2. Description of the Related Art

Electronic and mechanical devices are frequently placed in environments that may damage the components unless some form of protection is provided. For example, some electronic medical devices implanted into a body may be exposed to body fluids that may cause unprotected semiconductor circuits and non-electronic components to fail. Such devices may benefit from a hermetic packaging to limit exposure to these harmful elements. Traditional approaches to creating a protective hermetic package for an implantable medical device generally involve the complete encasement of the silicon or semiconductor components of the device in the hermetic package. Such packages typically utilize a metal such as titanium, or a ceramic material like alumina or zirconia. Various glass materials have also been employed. For example, hermetic cavities have been created to form small vacuum chambers for pressure transducers by bonding silicon components to either silicon or glass. The silicon component is usually fixed into a package with epoxy or soldered into the package. The complete encasement of the silicon component with a separate package adds to the size of the device and also increases its cost.

Similarly, other approaches that have been used for pressure transducers by enclosing the sensor in a metal packaging and coupling the environmental pressure to the sensor through a diaphragm bonded to the packaging. Such approaches place an interface between the environment and the sensor for the electronic components to interact with the environment and to protect the integrity of the device. Such a diaphragm may be made from the same or similar materials as the housing which protects the inner components to facilitates bonding and hermetic sealing of the diaphragm with the housing or protective barrier of the device.

SUMMARY OF THE INVENTION

In light of the above discussion, there still remains a need in the art for a system to accommodate medical devices that function effectively by having direct contact of the silicon component with the environment (in many cases, the body). The effective operation of some of these devices precludes complete encasement of the sensor in a protective package. Newer semiconductor components, however, such as semiconductor chemical sensors, may require such direct contact of the silicon component, thereby precluding complete encasement of the sensor. Similarly, pressure sensors fabricated by micro electro-mechanical systems (MEMS) techniques, as described in U.S. Pat. No. 6,331,163, herein incorporated by reference, require either direct contact with the environment or adequate transmission of environmental pressure through a medium to the sensor.

Accordingly, in one embodiment of the present invention, a method for hermetically sealing a silicon device is provided. The silicon device is coupled to a sensor, such as a pressure transducer, which benefits from having direct contact with its environment (the body). Thus, a method to hermetically seal the non-sensing portion of a silicon device while allowing the sensing portion (e.g. the pressure transducer) to have direct contact with the body is provided. In one embodiment, a silicon chip, a gold preform and a metallic housing are each primed for sealing and are assembled. The assembly is then heated to react the gold preform to the silicon chip and to form a molten gold-silicon alloy in-situ to bind said metallic housing to the non-sensing portion of the silicon chip. In this way, the non-sensing portion of the silicon chip is hermetically sealed, while still permitting exposure of the sensing portion of the silicon chip to the environment.

In one embodiment, a method for hermetically sealing an implantable silicon chip having a sensing portion is provided, comprising: providing a silicon chip having a sensing portion, an intermediate portion, and a non-sensing portion; providing a gold perform and a metallic housing, wherein said metallic housing comprises a first member and a second member; removing oxidation from the first member of said metallic housing and the intermediate portion of said silicon chip, thereby preparing said silicon chip for sealing; priming a surface of the intermediate portion of said silicon chip; priming a surface of said gold preform; generating a sealable assembly by assembling said silicon chip, said gold preform and the first member of said metallic housing; heating said sealable assembly in a vacuum to react said gold preform to the intermediate portion of said silicon chip; forming a molten gold-silicon alloy in-situ to bind the first member of said metallic housing to the intermediate portion of said silicon chip; and welding the first member of said metallic housing to the second member of said metallic housing to hermetically seal the non-sensing portion of said silicon chip. The step of providing a silicon chip may comprise providing a silicon chip with a micro-electrical mechanical system, providing a silicon chip coupled to a physiological sensor, and/or providing a silicon chip coupled to a pressure transducer. The step of providing a metallic housing may comprise providing a metallic housing comprising titanium or niobium. The step of forming a molten gold-silicon alloy in-situ comprises forming a molten gold-silicon-titanium alloy in-situ, or forming a molten gold-silicon-niobium alloy in-situ. The priming may further comprise rinsing said silicon member with a cleaning fluid and rinsing said gold preform with a cleaning fluid. The method may further comprise pretreating the first member of said metallic housing with a deposit metal. The pretreatment may be by sputtering said deposit metal onto the first member of said metallic housing and/or by electroplating said deposit metal to the first member of said metallic housing. The deposit metal may be selected from the group consisting of: nickel, copper, tin, silver, titanium and gold. The step of removing oxidation may be selected from the group consisting of one or more of the following treatments: chemical treatment and mechanical treatment. The chemical treatment may comprise treatment with an acid. The acid may comprise hydrofluoric acid. The mechanical treatment may comprise treatment with an abrasive.

In another embodiment, a method for hermetically sealing an implantable silicon chip is provided, comprising: providing a silicon chip, a gold preform and a metallic housing; priming a surface of said silicon chip, said metallic housing and said gold preform; generating a sealable assembly by assembling said silicon chip, said gold preform and said metallic housing; heating said sealable assembly to react said gold preform to said silicon chip; and forming a molten gold-silicon alloy in-situ to bind said metallic housing to said silicon chip, thereby hermetically sealing a portion of said silicon chip. The priming may comprise removing oxidation.

In still another embodiment, a hermetically sealable silicon apparatus is provided, comprising: a silicon chip; a gold preform; and a metallic housing; and a hermetic seal between said silicon chip and said metallic housing created by a gold-silicon alloy formed in situ by a reaction between said gold preform and said silicon member. The silicon chip may be a micro-electrical mechanical system pressure transducer. The gold preform may comprise a gold-silicon composite or a gold-germanium composite. The metallic housing may comprise a material selected from the group consisting of niobium, titanium, sapphire, molybdenum, tungsten, zirconium, zirconia, alumina, Alloy 36, Invar or Kovar. The gold-silicon alloy may comprise a gold-silicon-niobium alloy.

Several embodiments of the invention provide these advantages, along with others that will be further understood and appreciated by reference to the written disclosure, figures, and claims included herein.

BRIEF DESCRIPTION OF THE DRAWINGS

The structure and method of making the invention will be better understood with the following detailed description of embodiments of the invention, along with the accompanying illustrations, in which:

FIG. 1A shows a cross-sectional view of at least one embodiment of the invention. FIG. 1B shows an end view of the hermetic packaging with the preform shown in shadow outline.

DETAILED DESCRIPTION OF THE PREFERRED EMBODIMENT

Figure 2:
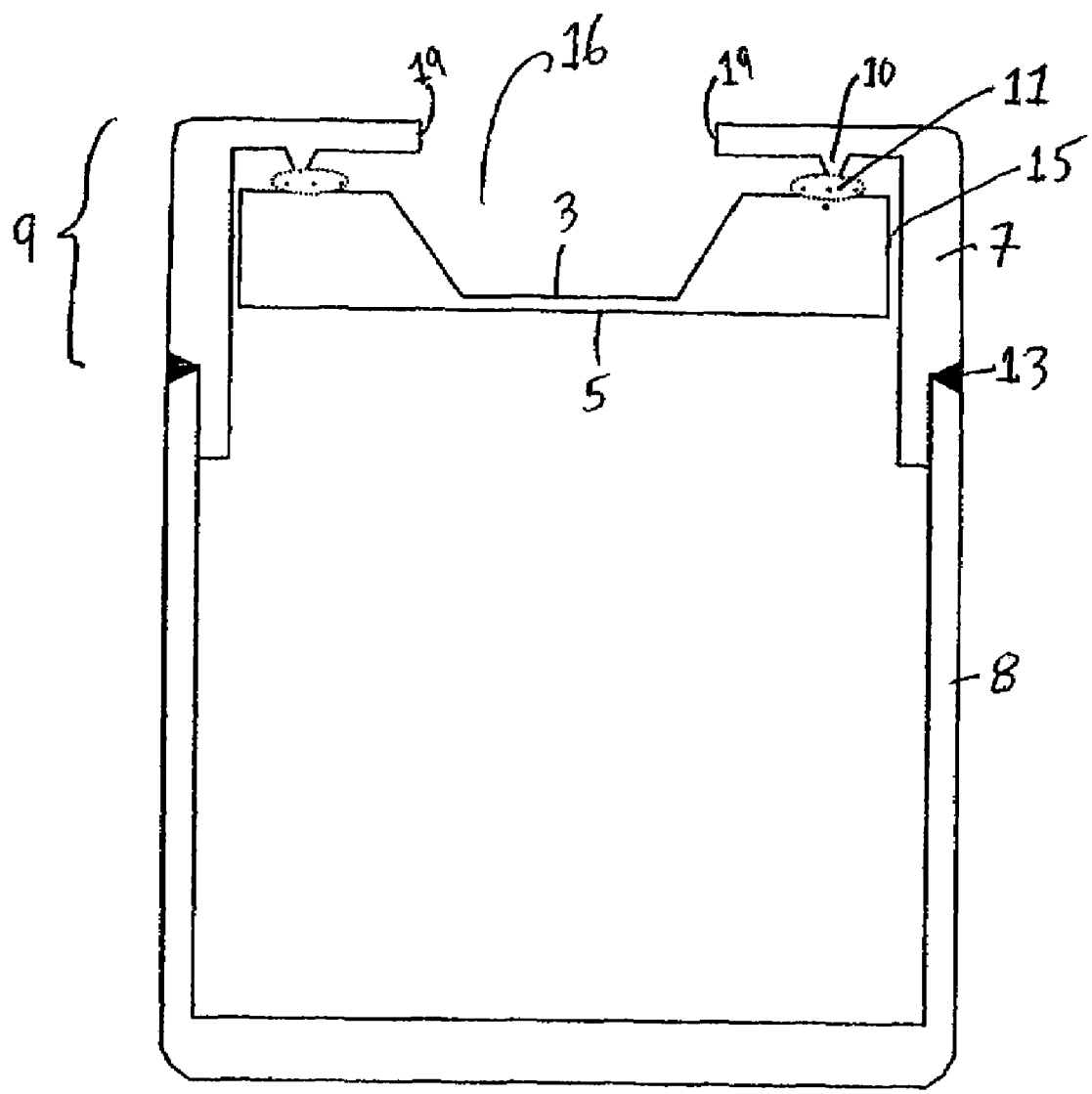
FIG. 2 depicts a cross-sectional view of at least one embodiment of the invention, wherein the silicon-gold alloy has been formed in-situ.

Traditional approaches to hermetic devices generally involve the complete encasement of the silicon or semiconductor components of the device in a hermetic package. Complete encasement, however, may not be suitable for all applications because direct contact between the silicon component and the environment is desired for many medical devices. The ability to provide direct contact of a silicon-based sensor to the environment while providing a protective hermetic package to the remaining portion of the silicon-based sensor and other components of a sensor or device is limited because current methods only teach the affixing of silicon-to-silicon, or silicon-to-glass, but not silicon to a metal or non-metal, except for silicon to gold-plated Kovar. Kovar is an iron-nickel-cobalt alloy often used for making glass-to-metal seals, but is unsuitable for implantation in the body because of biocompatibility problems.

Accordingly, in one embodiment of the present invention, a system for bonding silicon to biocompatible substrates to create bonds capable of hermetic sealing is provided. Several embodiments of the invention are particularly advantageous because they permit a method for hermetically sealing medical devices that are used for implantation in the human body.

Several embodiments of the invention are also advantageous because they accommodate packaging that is geometrically constrained to suboptimal shapes for some applications. A silicon packaging, for example, has sharp corners that increase thrombogenic risk when implanted into the body Another advantage of several embodiments of the invention is that the use of intermediate interfaces is not needed, thus reducing thermal and other coupling problems that can introduce large measurement errors in the sensor.

In one embodiment of the invention, a method for hermetically sealing a silicon chip is provided. The silicon chip is coupled to a sensor, such as a pressure transducer, which has a sensing portion and a non-sensing portion. In one embodiment, the non-sensing portion is sealed while allowing the sensing portion (e.g. the pressure transducer) to have direct contact with the body is provided. In one embodiment, a silicon chip, a gold preform and a metallic housing are each primed for sealing and are assembled. The term "primed" as used herein shall be given its ordinary meaning, but shall also mean the preparation of at least a portion of a surface for sealing, including but not limited to, cleaning said surface, chemically treating said surface, mechanically treating said surface, applying one or more coatings to said surface, and/or removing debris from said surface. In one embodiment, the assembly is heated to react the gold preform to the silicon chip and to form a molten gold-silicon alloy in-situ to bind said metallic housing to the non-sensing portion of the silicon chip. In one embodiment, heating is performed under vacuum. Thus, according to several embodiments of the invention, the non-sensing portion of a silicon chip is hermetically sealed, while still permitting exposure of the sensing portion of the silicon chip to the environment.

FIG. 1A and FIG. 1B show one embodiment of the hermetic packaging. In FIG. 1B, the preform shown in shadow outline. In one embodiment of the invention, a method of hermetically sealing a silicon component 1 to a metallic housing 2 is provided. In one embodiment, the silicon component 1 is a silicon chip, a silicon die or a silicon sensor. As seen in FIGS. 1A and 1B, a silicon component 1 comprising a sensing portion 3, an intermediate portion 4 and a non-sensing portion 5 is prepared by removing any oxides from the intermediate portion 4. In one embodiment, the sensing portion 3 comprises a physiological sensor. In one embodiment, the sensing portion 3 comprises a micro-electrical mechanical system pressure transducer. In one embodiment, the intermediate portion 4 comprises a surface of the silicon component 1 that may be either sealed or unsealed within the metallic housing 2. In one embodiment, the preparation is performed by chemical removal of oxides with an acid. In one embodiment, preparation is performed using hydrofluoric acid. In another embodiment, the preparation is performed by mechanical removal. In one embodiment, mechanical removal is performed using an abrasive. In one embodiment, the abrasive is a sand paper.

In one embodiment, the silicon component 1 is rinsed with a fluid. In another embodiment, the silicon component 1 is rinsed with an anhydrous fluid. In one embodiment, the silicon component 1 is rinsed with anhydrous acetone or anhydrous methanol. Those skilled in the art will understand that other cleaning compositions may be used. The silicon component 3 is then dried.

In one embodiment of the invention, a gold preform 6 is provided, as seen in FIG. 2. In one embodiment, the preform 6 ranges from about 0.0001" to about 0.010" in thickness. In another embodiment, the preform thickness is about 0.002" to about 0.006". In another embodiment, the preform 6 is 0.005" thick. In another embodiment, the preform 6 is made from a gold-silicon. In another embodiment, the preform 6 is made from a gold-germanium. One skilled in the art will appreciate that other metallic combinations may be used in accordance with several embodiments of the present invention.

In one embodiment, the preform 6 is rinsed with a fluid and then dried. In another embodiment, the preform 6 is rinsed with an anhydrous fluid. In one embodiment, the preform 6 is rinsed with anhydrous acetone or anhydrous methanol.

The metallic housing 2 may have any arbitrary cross-sectional shape. In one embodiment, the metallic housing is substantially circular in cross section. In one embodiment, the metallic housing 2 comprises a first member 7 and a second member 8 is provided. In one embodiment, the first member 7 comprises an opening 19. In one embodiment, the first member 7 comprises a biocompatible material. In one embodiment, the first member 7 comprises a metal having a thermal expansion generally similar to silicon and may be welded to other metals. In another embodiment, the first member 7 comprises niobium. Niobium is a biocompatible metal having a thermal expansion generally similar to that of silicon and may be welded to other metals. In another embodiment, the first member 7 of the metallic housing 2 is a metal selected from molybdenum, tungsten, zirconium, titanium or any alloy thereof. A combination of two or more materials may also be used. In some embodiments, the metallic housing comprises a portion of non-metallic material. In another embodiment, the first member is selected from sapphire, zirconia, alumina, "Alloy 36", Invar, Kovar or any other low expansion alloy. One skilled in the art will understand that other metals or metallic compositions may be used in accordance with several embodiments of the invention.

In one embodiment, at least a portion of the first member 7 is pretreated with a deposit material (not shown). In one embodiment, the deposit material enhances wettability, but the embodiments of the invention described herein should not be limited or be based upon this objective. In one embodiment, the deposit material comprises a plating of nickel, copper, tin, silver or a combination thereof. In another embodiment, the deposit material is a sputtering of titanium, nickel, copper, tin, silver, gold or a combination thereof. In another embodiment, the deposit material is a chemical compound. One skilled in the art will understand that other metals, chemicals or combinations thereof may also be used.

In one embodiment, the silicon component 1, the preform 6 and the first member 7 of the metallic housing 2 are assembled together to form a sealable assembly 9. In one embodiment, the silicon component 1, the preform 6 and the first member 7 of the metallic housing 2 are self-aligning. In one embodiment, indentations (not shown) on the preform 6 may self-align with protrusions 10 from the first member 7 of the metallic housing 2. In another embodiment, the preform 6 may self-align with indentations (not shown) on the silicon component 1. Other indicators of alignment may also be used in accordance with several embodiments of the current invention.

In one embodiment, a heat source having a temperature generally about 300 degrees Celsius to about 1200 degrees Celsius is applied to the gold preform 6. In another embodiment, the heat source has a temperature of about 400 degrees Celsius to 500 degrees Celsius. In another embodiment, the heat source has a temperature of about 430 degrees Celsius to about 460 degrees Celsius. In one embodiment, the heat source is an oven. In another embodiment, the heat source is a laser welder. In another embodiment, the heat source is an electron beam welder. In another embodiment, the heat source is applied for about 10 minutes. In one embodiment, the heat source application occurs in a vacuum for at least a certain portion of time.

In one embodiment, the silicon component 1 and the gold preform 6 react to form a silicon-gold alloy 11 in-situ. In another embodiment, the silicon component 1, the gold preform 6 and a first member 7 comprising niobium react to form a silicon-gold-niobium alloy 11 in-situ. In another embodiment, the silicon component 1, the gold preform 6 and a first member 7 comprising titanium react to form a silicon-gold-titanium alloy 11 in-situ.

Figure 3A:
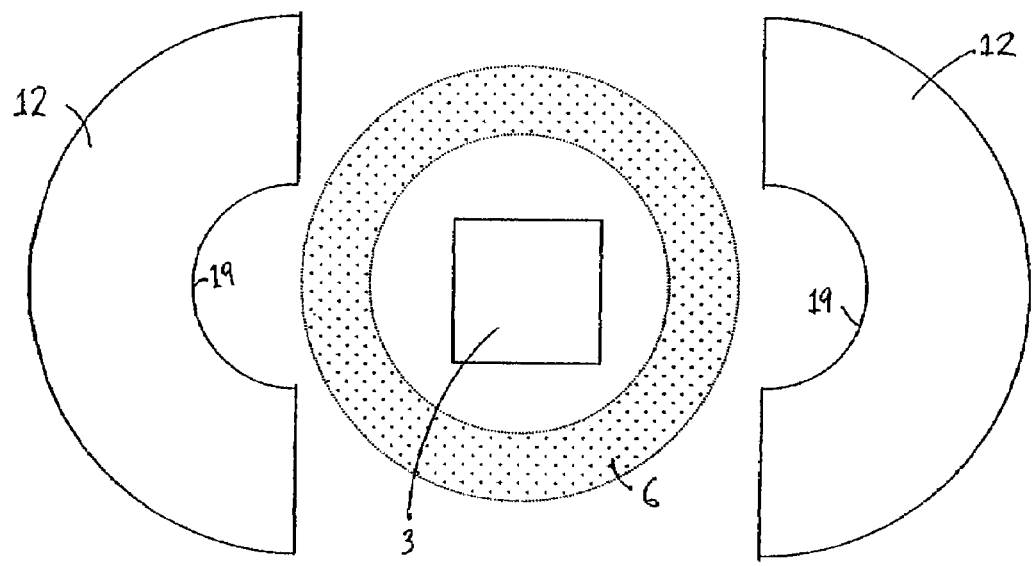
FIG. 3A illustrates a side view at least one embodiment of the invention, wherein the silicon member is joined to multiple packaging members.
Figure 3B:
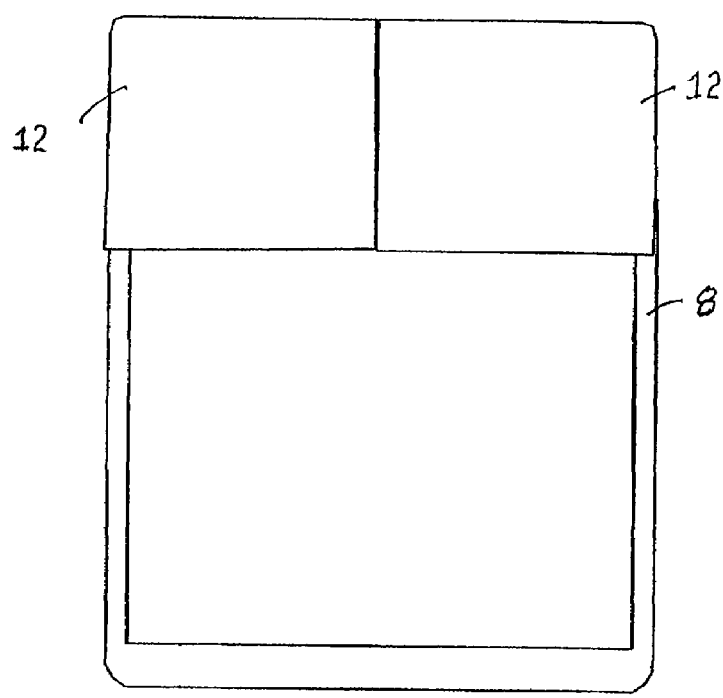
FIG. 3B is an end-view of the hermetic packaging with a plurality of members of the first packaging member shown separately from the silicon members.

The alloy 11 wets and bonds the first member 7 to the silicon component 1. In one embodiment, the in situ formation of alloy 11 provides a stronger hermetic seal. In one embodiment, the first member 6 comprises a shape. In one embodiment, the shape is any shape capable of forming a seal on the silicon member 1. In one embodiment, the shape is any closed shape. In one embodiment, the shape is an annular ring. In another embodiment, depicted in FIG. 3A and FIG. 3B, the first member 7 of the metallic housing 2 further comprises a plurality of sections 12 capable of forming a seal around on a portion of the silicon component 1.

Figure 4:
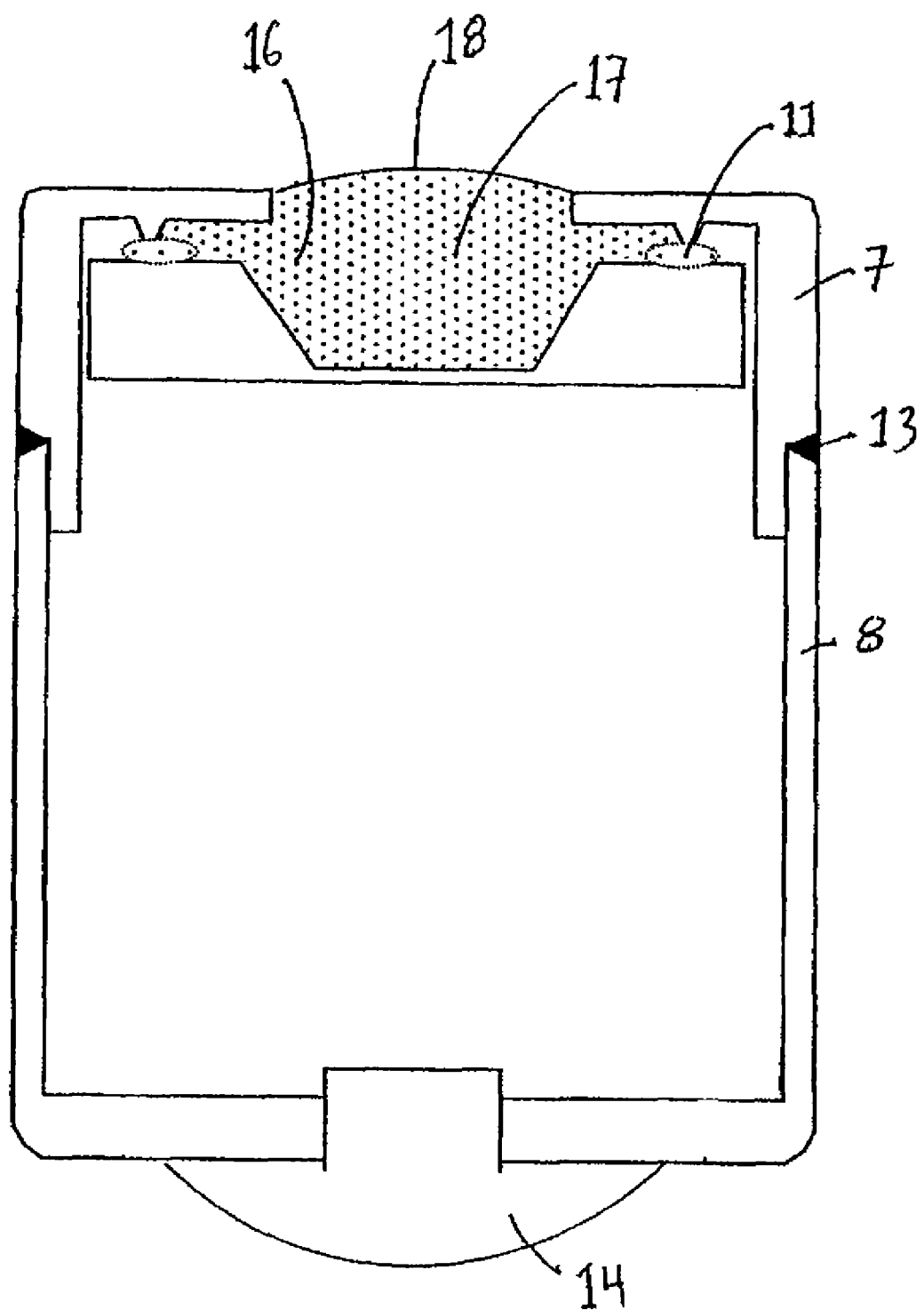
FIG. 4 shows at least one embodiment of the invention, wherein the hermetic packaging also provides a ceramic feedthrough for leads or conductors to pass out of the hermetic packaging and a protective silicone gel.

In one embodiment, the sealable assembly 9 is cooled to room temperature. In another embodiment, the assembly 9 is cooled under a vacuum to room temperature. In one embodiment, the assembly 9 is joined hermetically to the second member 8 of the metallic housing 2 by a weld 13, as shown in FIG. 2. In one embodiment, the hermetic joining occurs through a laser or electron beam weld. In one embodiment, the metallic housing 2 further comprises a ceramic or glass feedthrough 14 to provide attachment of leads or conductors (not shown) to components inside the metallic housing, as in FIG. 4. In one embodiment, the packaging is hermetic to at least $1 \times 10^{-9}$ cc/sec helium. In another embodiment, the hermeticity is at least $1 \times 10^{-12}$ cc/sec helium.

Figure 5:
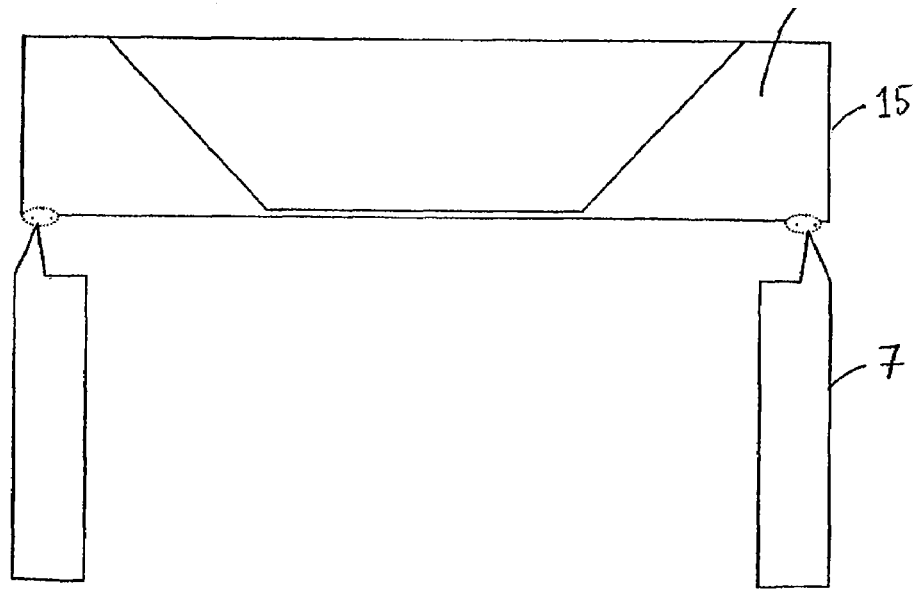
FIG. 5 represents at least one embodiment of the invention, where the edges of the silicon member lie outside the hermetic packaging and the sensing element faces the environment.
Figure 6:
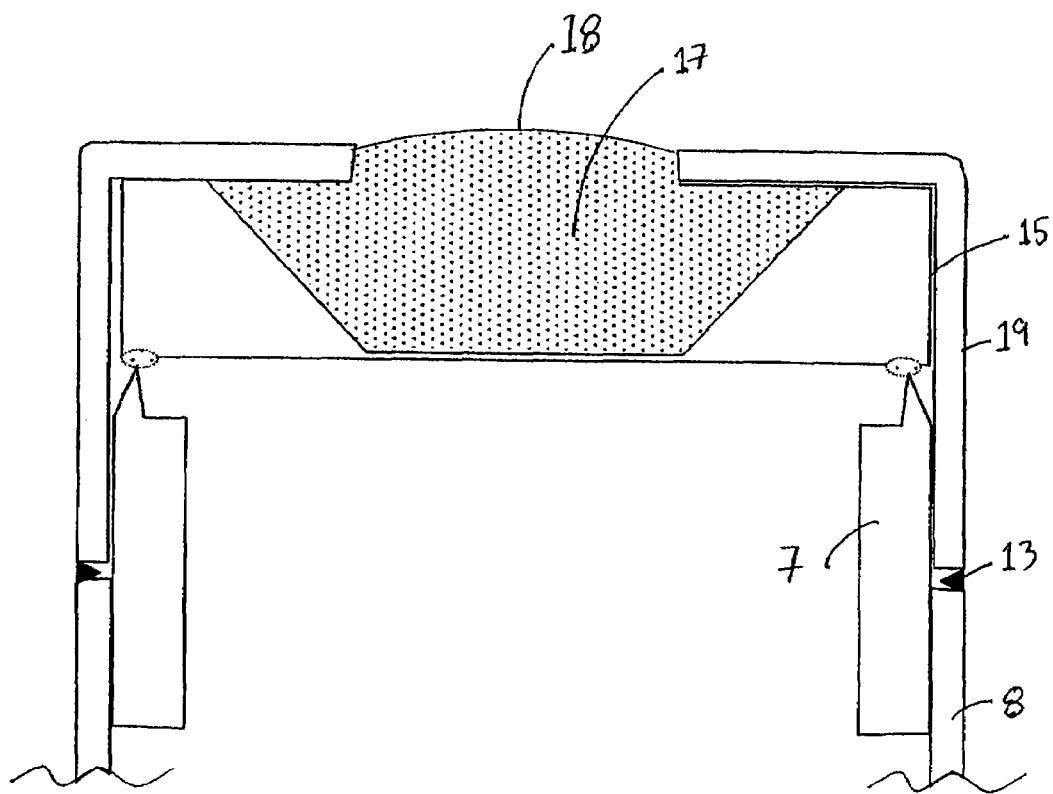
FIG. 6 shows a further embodiment of the invention where the edges of the silicon member are covered by a metal cap that is welded to the second member of the metallic housing

In one embodiment, as shown in FIG. 1, the edges 15 of the silicon component 1 are enclosed by the first member 7. Enclosing the edges 15 of the silicon member 1 by the first member 7 may reduce thrombus formation and tissue ingrowth about the sensing portion of the silicon component, but the embodiments of the invention described herein should not be limited or be based upon this objective. In one embodiment, depicted in FIG. 4, a space 16 may be formed by the first member 7 of the metallic housing 2 and the silicon component 1 to contain a protective silicone gel 17. The silicone gel 17 may optionally have a titanium or parylene coating 18 to maintain it in the space 16. In one embodiment, the titanium or parylene coating 18 may be attached to the metallic housing 2 by an adhesive (not shown). In another embodiment, the coating 18 is welded to the metallic housing 2. In another embodiment, shown in FIG. 5, the edges 15 of the silicon component 1 are not enclosed by the first member 7. In one embodiment, the edges 7 of the silicon component may optionally be protected by a metal cap 19, depicted in FIG. 6.

Figure 7:
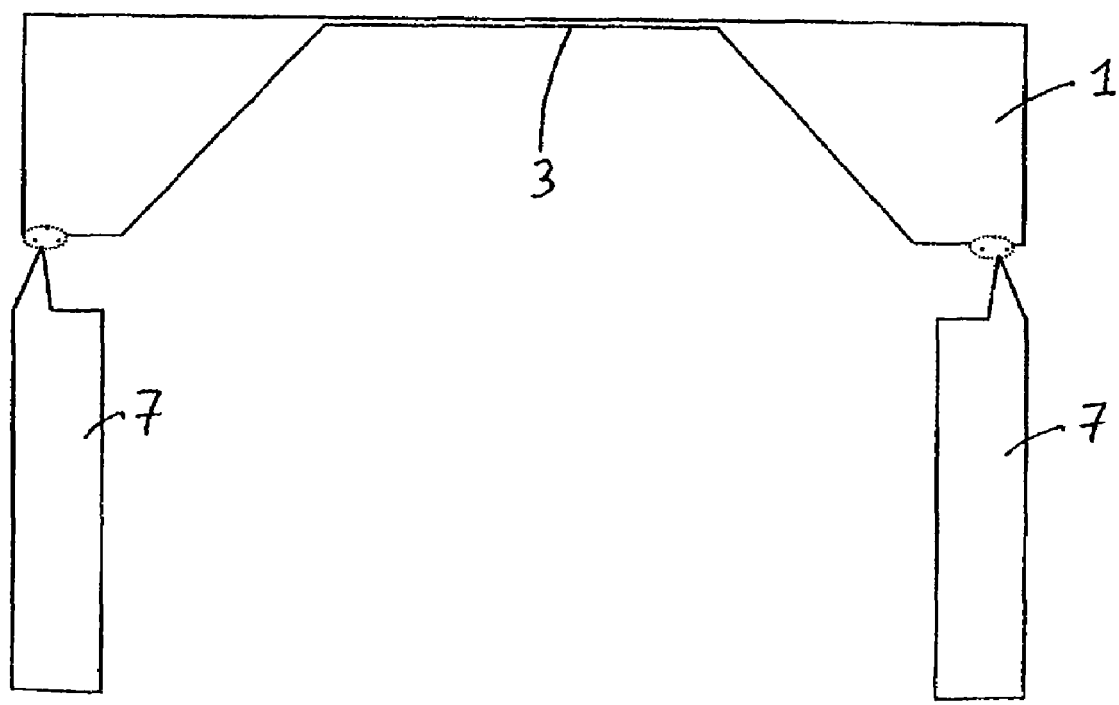
FIG. 7 depicts at least one embodiment of the invention wherein the edges of the silicon member lie outside the hermetic packaging and the sensing element faces inside to the hermetic packaging.

The metal cap 19 may be attached to either the first member 7 or the second member 8 of the metallic housing 2. The attachment of the metal cap 19 may be either hermetic or non-hermetic. In another embodiment, depicted in FIG. 7, the sensing portion 3 of the silicon component 1 faces into the metallic housing formed by the first member 7.

The following Example illustrates various embodiments of the present invention and are not intended in any way to limit the invention.

EXAMPLE 1

In one embodiment of the invention, a method of hermetically sealing a MEMs pressure transducer to a niobium housing is provided. The MEMs pressure transducer comprises a sensing portion, an intermediate portion and a non-sensing (or non-exposable) portion. In one embodiment, the intermediate portion is a surface generally surrounding around the sensing portion. In another embodiment, the intermediate portion is a surface generally surrounding the non-exposable portion. The intermediate portion comprises the surface of the MEMs pressure transducer that may be left sealed or unsealed within the metallic housing. The MEMs pressure transducer is prepared for sealing by deoxidizing the surface of the intermediate portion to be bonded to the metallic housing with hydrofluoric acid. The surface to be bonded is then rinsed with anhydrous acetone or methanol and then dried. A pure gold preform, having a thickness of 0.005" is cleaned with anhydrous acetone and then dried. At least a portion of the niobium housing is prepared for bonding by pretreating the surface to be bonded with an electroplating of gold. The metallic housing is chemically deoxidized with hydrofluoric acid, rinsed with anhydrous acetone and dried. The MEMs pressure transducer, the gold preform and the metallic housing are assembled to form a sealable assembly, with the gold preform placed between the MEMs pressure transducer and the metallic housing at the site of desired bonding. The assembly is placed into a vacuum oven and a pressure of about 1 megaPascal is applied to the assembly. The assembly is heated at about 445 degrees Celsius for about 10 minutes. A silicon-gold-niobium alloy is formed in situ at the binding site from the silicon from the MEMs pressure transducer, the gold in the preform and the niobium from the metallic bonding. The alloy wets and then bonds the MEMs pressure transducer to the metallic housing. The sealable assembly is removed from the vacuum oven and is cooled to room temperature in a vacuum chamber. Other components may then be hermetically joined to the assembly to form the hermetically sealed housing. Other components may include additional portions of the metallic housing, or a ceramic feedthrough to allow leads and connectors to transit in or out of the metallic housing. These other components may be welded to the metallic housing of the assembly by laser welding or electron beam welding.

While this invention has been particularly shown and described with references to embodiments thereof, it will be understood by those skilled in the art that various changes in form and details may be made therein without departing from the scope of the invention. For all of the embodiments described above, the steps of the methods need not be performed sequentially.

What is claimed is:

1. A hermetically sealable silicon apparatus comprising:
   a silicon chip;
   a gold preform; and
   a metallic housing; and
   a hermetic seal between said silicon chip and said metallic housing created by a gold-silicon alloy formed in situ by a reaction between said gold preform and said silicon member.

2. The apparatus of claim 1, wherein said silicon chip is a micro-electrical mechanical system pressure transducer.

3. The apparatus of claim 1, wherein said gold preform comprises a gold-silicon composite.

4. The apparatus of claim 1, wherein said gold preform comprises a gold-germanium composite.

5. The apparatus of claim 1, wherein said metallic housing comprises a material selected from the group consisting of niobium, titanium, sapphire, molybdenum, tungsten, zirconium, zirconia, alumina, Alloy 36, Invar or Kovar.

6. The apparatus of claim 1, wherein said metallic housing comprises niobium.

7. The apparatus of claim 6, wherein said gold-silicon alloy comprises a gold-silicon-niobium alloy.

* * * * *